United States Patent [19]

Bruno

[11] Patent Number: 5,523,557
[45] Date of Patent: Jun. 4, 1996

[54] OPTOELECTRONIC DEVICE INTEGRATING A LIGHT GUIDE AND A PHOTODETECTOR HAVING TWO DIODES ARRANGED SIDE BY SIDE ON A SEMICONDUCTOR SUBSTRATE

[75] Inventor: Adrien Bruno, Palaiseau, France

[73] Assignee: France Telecom, Paris, France

[21] Appl. No.: 427,872

[22] Filed: Apr. 26, 1995

[30] Foreign Application Priority Data

Apr. 26, 1994 [FR] France ................... 94 05004

[51] Int. Cl.⁶ ............................................ H01J 40/14
[52] U.S. Cl. .................. 250/214.1; 257/432; 257/443; 257/84; 385/14
[58] Field of Search .................... 250/214.1; 257/432, 257/434, 443, 83, 84, 85; 385/14, 15, 129, 130, 131, 132

[56] References Cited

U.S. PATENT DOCUMENTS

| | | | |
|---|---|---|---|
| 5,193,131 | 3/1993 | Bruno | 385/14 |
| 5,261,014 | 11/1993 | Bruno et al. | 385/14 |
| 5,324,929 | 6/1994 | Yamada et al. | 250/214.1 |
| 5,332,919 | 7/1994 | Fujimura | 257/434 |
| 5,365,101 | 11/1994 | Tonai | 257/434 |
| 5,412,299 | 5/1995 | Kuhara et al. | 257/432 |
| 5,455,514 | 10/1995 | Yamada et al. | 257/434 |

FOREIGN PATENT DOCUMENTS

| | | |
|---|---|---|
| 0531215 | 3/1993 | European Pat. Off. . |
| 2676126 | 11/1992 | France . |

OTHER PUBLICATIONS

Proceedings SPIE-The International Society for Optical Engineering, Physical Concepts of Materials for Novel Optoelectronic Device Applications II: Device Physics and Applications, vol. 1362, 1990, pp. 959–966, D. Decoster, et al, "Photodetectors: How To Integrate Them With Microelectronic and Optical Devices?".

*Primary Examiner*—Edward P. Westin
*Assistant Examiner*—Steven L. Nichols
*Attorney, Agent, or Firm*—Oblon, Spivak, McClelland, Maier & Neustadt

[57] ABSTRACT

Optoelectronic device integrating a photodetector having two diodes arranged side by side, constructed from layers of semiconductor material on a substrate that also incorporates a light guide for directing light to the diodes. The two identical, juxtaposed diodes (D1, D2) are arranged head to tail. The diode ensuring the photodetection is that which is reverse biased.

7 Claims, 6 Drawing Sheets

OPTOELECTRONIC DEVICE INTEGRATING A LIGHT GUIDE AND A PHOTODETECTOR HAVING TWO DIODES ARRANGED SIDE BY SIDE ON A SEMICONDUCTOR SUBSTRATE

TECHNICAL FIELD

The present invention relates to an optoelectronic device integrating a photodetector which is electrically equivalent to two diodes arranged in head to tail manner. The invention is used in optoelectronics and in particular optical telecommunications, where the device according to the invention can constitute the optical receiver of a heterodyne reception circuit.

The device according to the invention can also be used in optical interconnections between fast electronic "chips" having a high degree of integration or between or within computers.

PRIOR ART

An optoelectronic device having an optical guide and photodetector in integrated form is generally formed on a semiconductor substrate and is successively constituted by a lower confinement layer, a layer forming an optical guide and an upper confinement layer. This structure is completed by a photodetector placed either in the lower part of the substrate, a mirror at 45° reflecting downwards the light from the guide layer, or at the end of the guide layer, or above the guide layer for an evanescent wave operation.

The device according to the present invention relates to the third type and this will be described in greater detail hereinafter.

An integrated detector-guide device with coupling by evanescent wave is e.g. described in the article by R. J. Deri et al entitled "Integrated Waveguide/Photodiodes with vertical Impedance Matching", published in Proceedings of the 1989 IEDM, Washington D.C., December 1989, as well as in the synthesis article by R. J. Deri entitled "Monolithic Integration of Optical Waveguide Circuiting with III–V Photodetectors for Advanced Lightwave Receivers", published in Journal of Lightwave Technology, vol. 11, no. 8, August 1993, pp. 1296–1312.

FIG. 1 shows in perspective a device of this type with a $n^+d$ doped substrate S, a guide layer CG, an anti-reflection layer CaR, an absorber Ab, a $p^+$ doped layer Ab($p^+$) and a metal contact M. In this example, the photodetector is formed by the PIN diode constituted by the stack Ab($p^+$)/Ab/CaR/CG/S($n^+$).

FIG. 2 shows a section through the photodetector in an embodiment described in French patent application FR-A-2 676 126 (or the corresponding U.S. Pat. No. 5,193,131).

Certain means are the same as in FIG. 1 and carry the same references. The structure of FIG. 2 differs from that of FIG. 1 by the presence of a reflecting layer CR and the fact that the layer CaR is $N^+$ doped so as to reduce the transit time of the carriers. It is also possible to see the lower confinement layer CiC.

In these two variants, the upper confinement layer does not really exist, ambient air providing the low index appropriate for confinement.

The PIN diode is not the only possible structure making it possible to obtain a photodetector in an integrated electronic structure. It is also possible to use MSM (Metal-Semiconductor-Metal) diodes, whose contacts are interdigitated, or lateral PIN diodes where the contacts are juxtaposed. However, these devices are difficult to produce due to the fineness of the contacts. Thus, it is generally preferable to use a conventional PIN diode.

However, the PIN diode also gives rise to problems. Thus, the two metal contacts surrounding it must be produced on two semiconductors having two doping types, one being of the p type and the other of the n type. If it is wished to reduce the contact resistances, the metal must be chosen as a function of the semiconductor on which it is deposited. Thus, for example, the expert will use the alloy Au—Mn—Ti—Au on a p layer and the Ni—Ge—Au alloy on a n layer. Thus, this involves performing two different metallization operations. Moreover, these two contacts are not at the same level, one being located at the top and the other at the bottom of the stack.

The problem which the invention aims to solve is the definition of an optoelectronic device having an optical guide and integrated photodetector in which the photodetector, whilst still being of the PIN diode type, has a structure that the same metallization is possible (instead of two), this metallization affecting one instead of two levels.

It can also be observed that in the prior art optoelectronic devices, the electrical part occupies a significant amount of space in the device (e.g. a 200×200 µm surface), whereas an optical guide only occupies a width of a few microns.

Although the solution recommended by the invention is aimed essentially at the photodetector, it also leads to a supplementary advantage of permitting a better utilization of the space left available on the optical guide side. This space can receive two or even more than two optical guides instead of one.

DESCRIPTION OF THE INVENTION

Therefore the present invention proposes using, as the photodetector, two diodes arranged in head to tail manner and symmetrically juxtaposed. In operation, one of the diodes is reverse biased and serves as the photodetection means, whereas the other, which is necessarily forward biased, conducts the photodetection current. The first metal contact is placed at the top of one of the diodes and is in contact with an e.g. p type semiconductor, as in the prior art. However, the second metal contact is placed on the top of the other diode, i.e. is at the same height as the first. It is also in contact with a p type semiconductor. Thus, it is possible to carry out a single metallization operation using the same metal and said metallization applies to two levels at the same height.

More specifically, the present invention relates to an optoelectronic device having an integrated optical guide and photodetector comprising, on the same substrate, layers constituting optical guidance means and, on part of these layers, a photodetector constituted by a first stack of semiconductor layers forming a first diode, said device also incorporating means for polarizing the first diode, said device being characterized in that the photodetector also has a second stack, identical to the first and placed alongside the latter, said second stack constituting a second diode, the polarization means being connected to the first diode across the second, the two diodes thus being arranged in head to tail manner, one being reverse biased and the other forward biased.

The photodetector can incorporate two PIN diodes or two NIP diodes.

It is pointed out that optoelectronic devices having two diodes are already known, in the case of coherent receivers having two balanced diodes. However, in the latter case, the two diodes are not arranged in head to tail manner. It is consequently not possible to use a single metallization type with only two contacts at a single level. In said prior art, each diode has its two metallizations at two different levels. Moreover, in said devices, the two diodes operate simultaneously as photodetectors, whereas in the present invention, only the reversed-biased diode ensures the photodetection, whereas the other forward-biased diode only ensures the passage of the photocurrent.

In the structure of the invention, which is symmetrical and has two diodes, it is possible to make each diode serve as the photodetector, the other diode then being responsible for the flow of photocurrent. Thus, it is possible to associate two instead of one optical guide, which will pass successively beneath the two diodes. By the reverse biasing of one or other of the diodes, it is possible to work with one or other of the guides. The addition of an optical guide permits a better utilization of the space left free on the optical guidance side. It is also possible to pass several guides beneath the same diode.

In order to clearly show the symmetrical character of he double stack obtained and its reversible nature, the applicant has used the acronyms "PINIP" of "NIPIN" for his structure and these clearly demonstrate that the order of the layers traversed by the photodetection current is always the same, no matter what the current flow direction and therefore no matter what the polarization. Throughout the present description, the photodetection means will be referred to as PINIP or NIPIN photodetector.

DETAILED DESCRIPTION OF THE EMBODIMENTS

Figure 1:
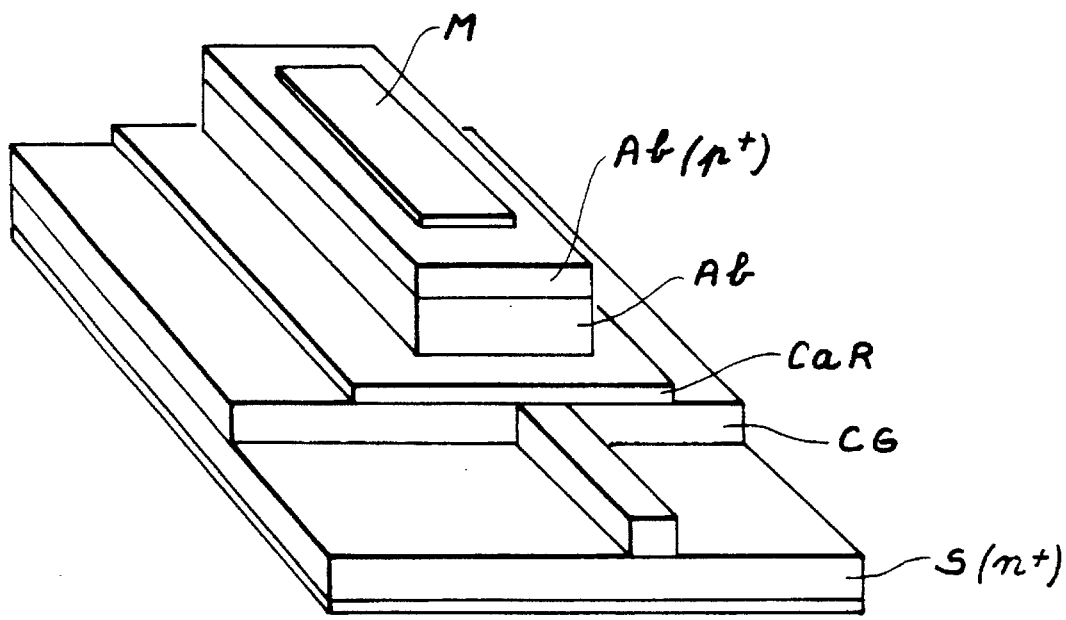
FIG. 1 Already described, shows a prior art photodetector.
Figure 2:
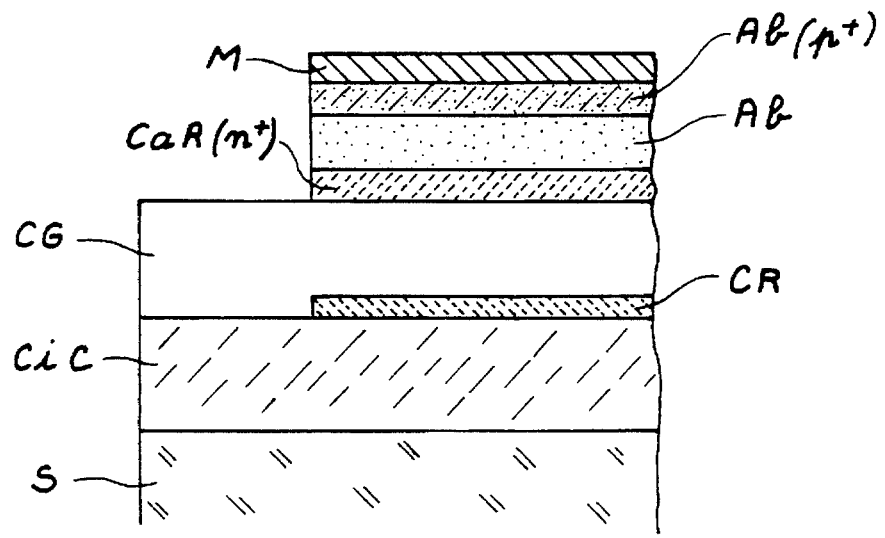
FIG. 2 Already described, shows in section another photodetector according to the prior art.
Figure 3:
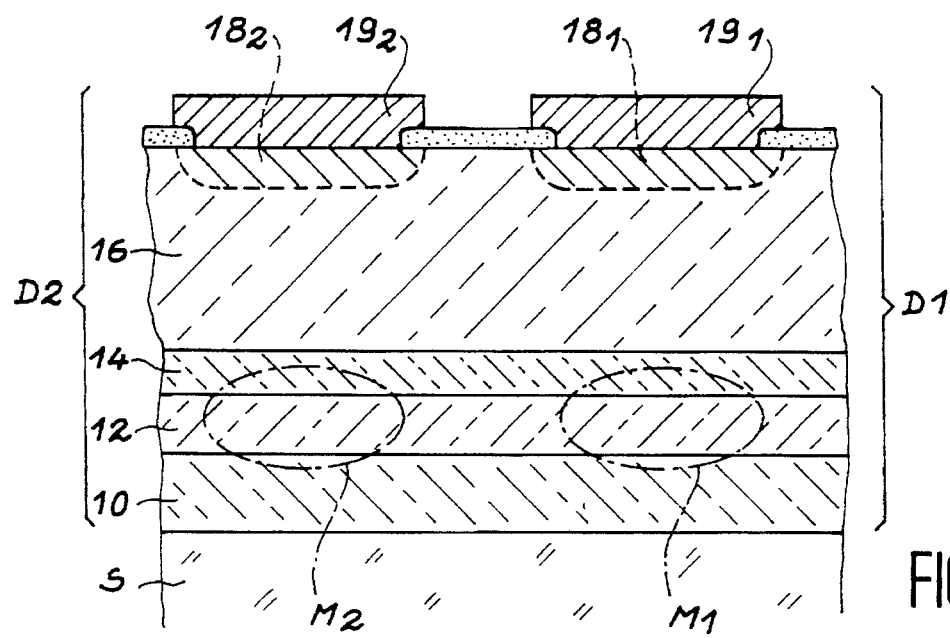
FIG. 3 In section, shows a first embodiment of a PINIP photodetector according to the invention.

FIG. 3 shows a first embodiment of the device according to the invention shown in sectional form along a plane passing through the photodetector. On a substrate S are successively provided a lower confinement layer 10, a guidance layer 12, a n doped layer 14, an intrinsic layer 16, a type p, first diffused zone $18_1$, a type p, second diffused zone $18_2$, a first metallic contact $19_1$ and a second metallic contact $19_2$.

The diode D1 is formed by the right-hand stack using the zone $18_1$ and the contact $19_2$, whilst the diode D2 is formed by the left-hand stack utilizing the zone $18_2$ and the contact $19_2$.

Figure 4:
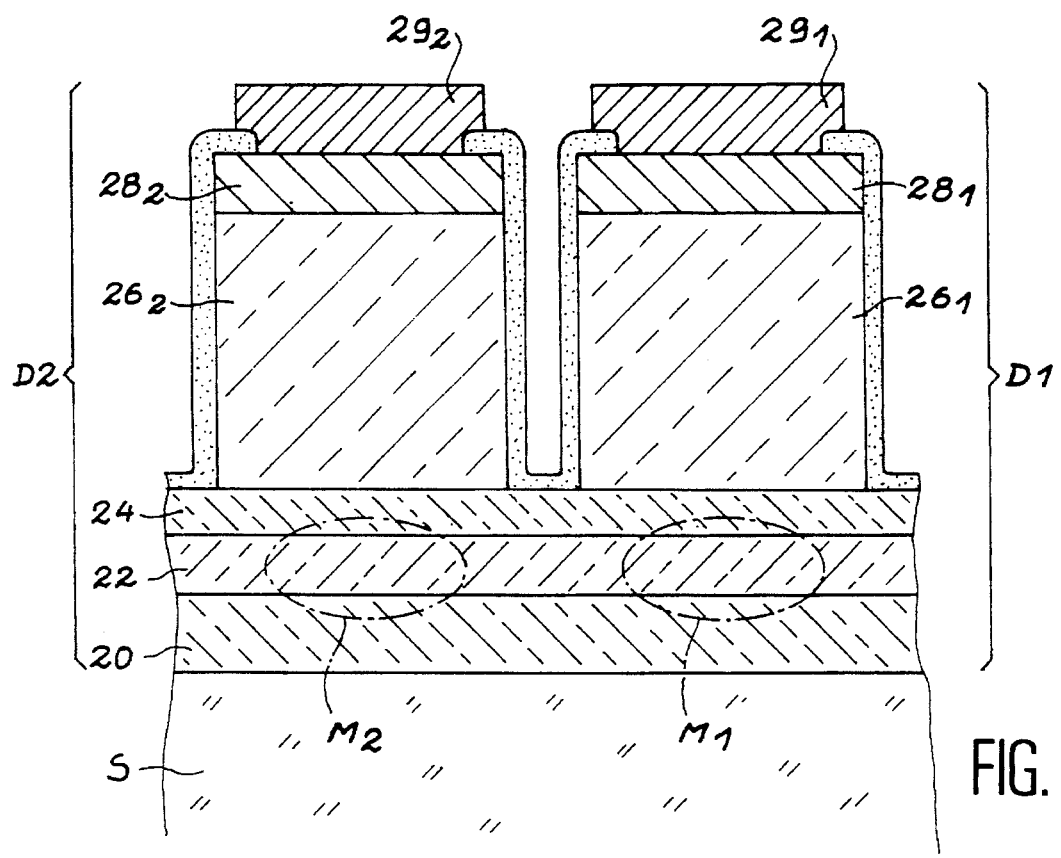
FIG. 4 Illustrates in section a second embodiment of a PINIP photodetector according to the invention.

In FIG. 4, the device comprises on a substrate 5, in succession a lower confinement layer 20, a guidance layer 22, a n doped layer 24, a first intrinsic layer $26_1$ and a second intrinsic layer $26_2$, a first p doped layer $28_1$, a second p doped layer $28_2$, a first metallic contact $29_1$ and a second metallic contact $29_2$.

Figure 5:
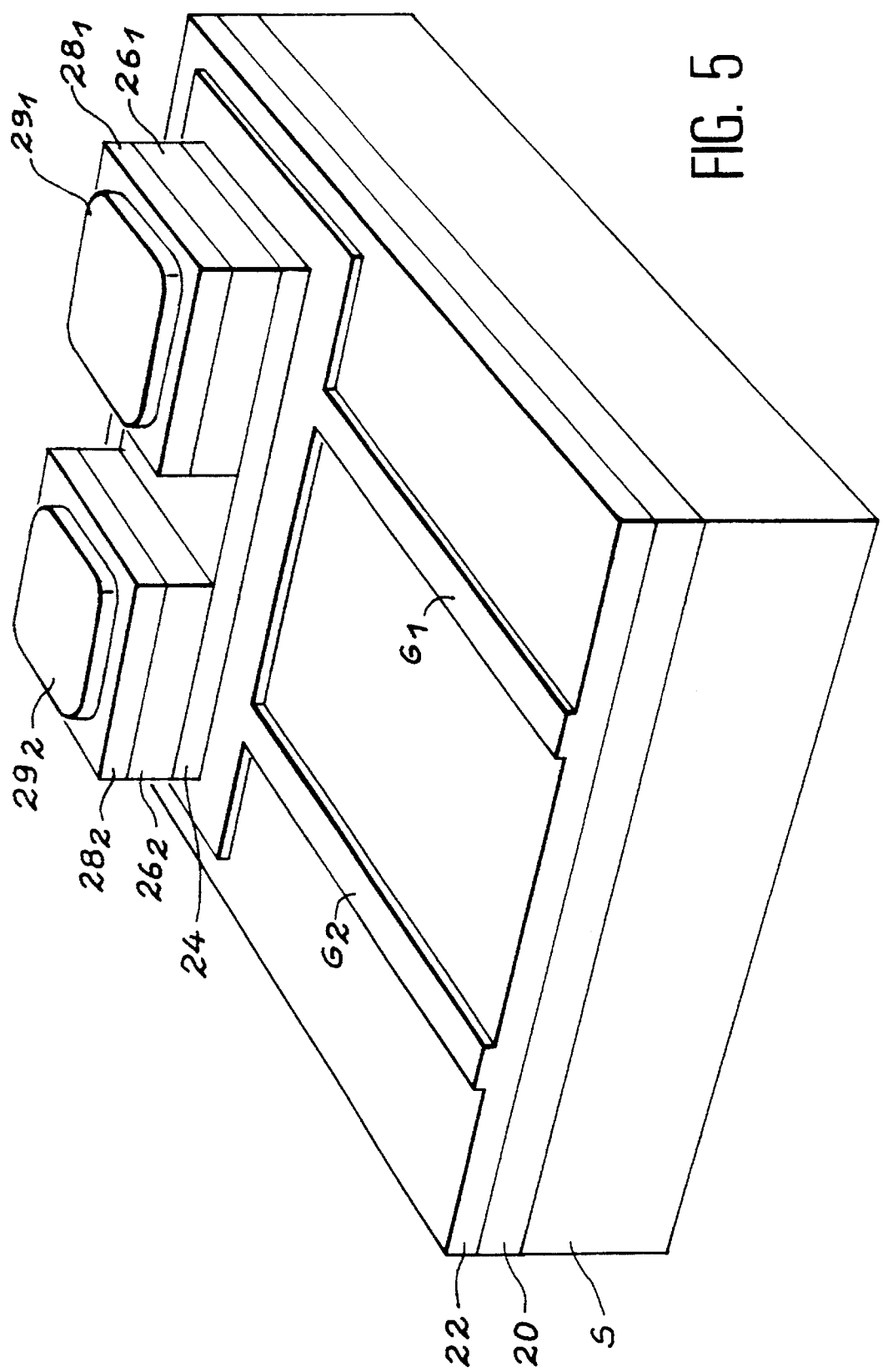
FIG. 5 Shows a device according to the invention with two optical guides.

FIG. 5 again illustrates this second variant but in perspective. The same elements can be seen as in FIG. 4 and they are given the same references. The interest of FIG. 5 is that it shows that two optical guides G1, G2 can be used and that they pass beneath the two diodes D1, D2, i.e. beneath the stacks $26_1$, $28_1$, $29_1$ and $26_2$, $28_2$, $29_2$. Therefore two optical beams can be present in such a structure, alternately in G1 and G2. On returning to FIGS. 3 and 4, it can be seen that the location of the two possible optical modes is diagrammatically illustrated by the two ovals M1 and M2.

A possible production process for such a structure can consist of the following operations:

1) Initially there is an InP substrate and by epitaxy deposition successively takes place of the following materials (their thickness being given in brackets):

Inp (1 μm): layer 20

GaInAsP (0.9 μm): layer 20 n$^+$ doped GaInAsP (0.4 μm): layer 24

GaInAs (intrinsic) (1 μm): layer $26_1$, $26_2$ p$^+$ doped InP (0.5 μm): layer $28_1$, $28_2$ p$^+$ doped GaInAs (50 nm): layer $28_1$, $28_2$ 2) By ion beam etching (IBE) or reactive ion etching (RIE), a channel is formed in the stack in order to provide two mesas, the n$^+$ doped GaInAsP layer 24 being left.

3) By means of a nitride or a resin, protection takes place of a slightly wider zone of a few μm and chemically and selectively the structure is etched down to the GaInAsP guide layer 22.

4) The optical guides are etched by RIE.

5) The guide-detector assembly is protected and etched down to the substrate by RIE.

6) A polyimide is deposited and in the latter are formed two openings at the top of two mesas.

7) A metallic deposit is made in the openings and the blocks are produced which constitute the two p$^+$ contacts of the PINIP photodetector.

In the embodiments of FIGS. 3, 4 and 5, there is no upper confinement layer, the upper confinement being automatically obtained by the free air present above the guidance layer.

Figure 6:
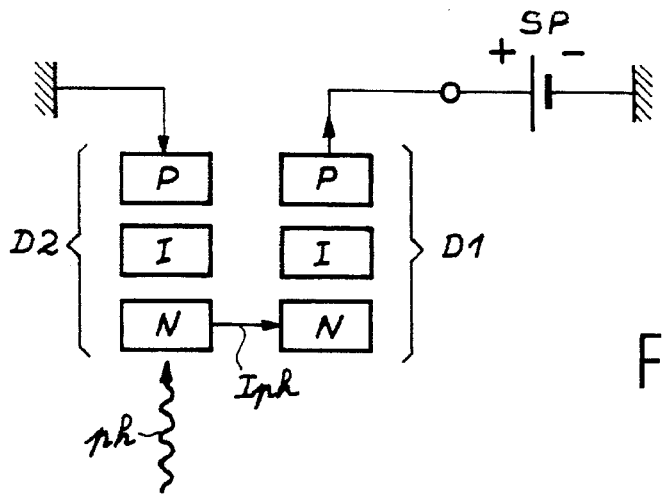
FIG. 6 Is a diagram of the PINIP structure.
Figure 7:
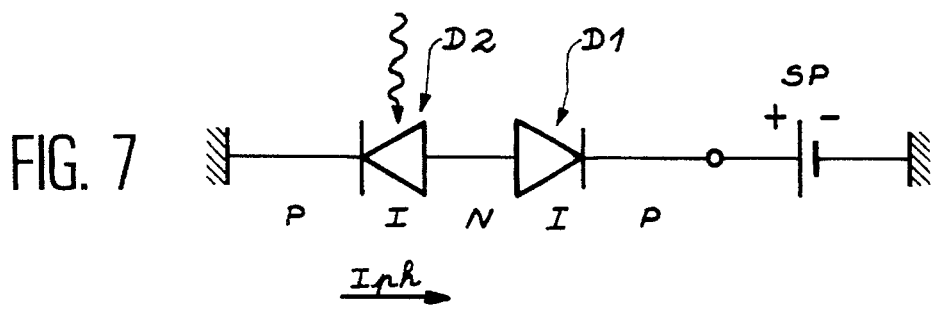
FIG. 7 Is an electric circuit equivalent to the PINIP structure.
Figure 8:
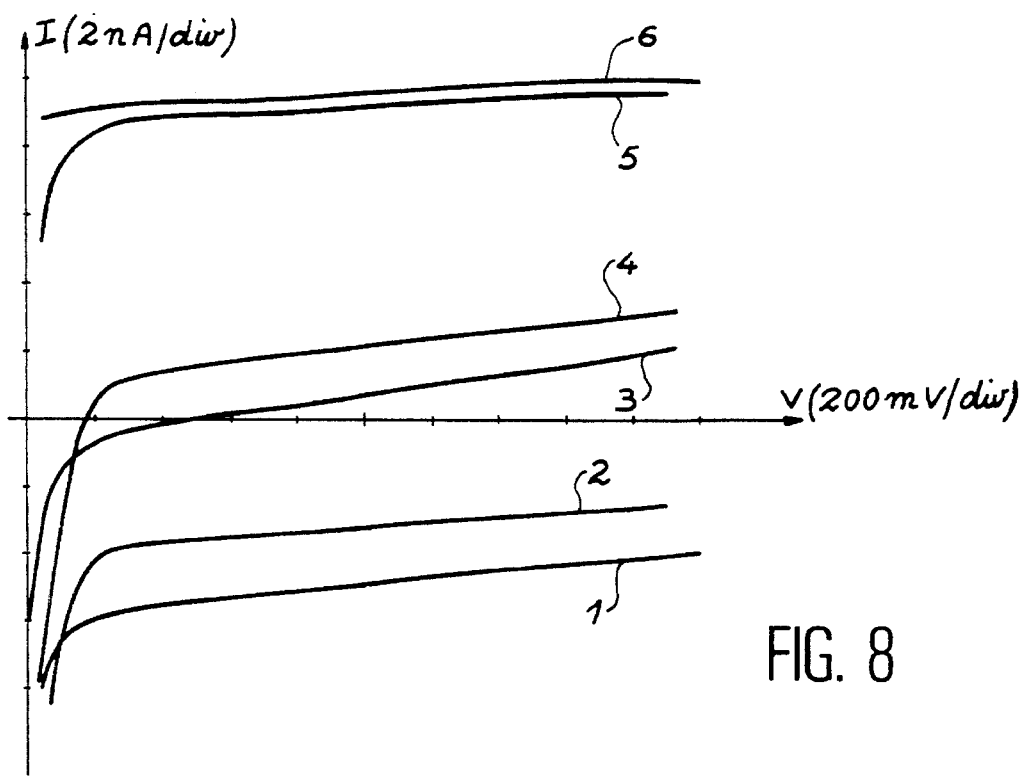
FIG. 8 Is a set of current-voltage curves.

The electrical characteristics of the PINIP structure according to the invention can be explained with the aid of FIGS. 6, 7 and 8.

FIG. 6 firstly diagrammatically shows the structure with its double PIN stack forming two PIN diodes, respectively D1 and D2. FIG. 6 also shows the flow direction of the photocurrent Iph for an illumination ph directed onto the diode D2. In FIG. 6 the polarization produced by the voltage source SP is such that the diode D2 is reverse biased and the diode D1 forward biased.

FIG. 7 shows the equivalent electrical diagram of the structure. It illustrates the head to tail arrangement of the two diodes D1 and D2 and once again the flow direction of the photocurrent. Blocking takes place by one of the diodes for the external current, both in forward and reverse.

The resistance of the PINIP structure is given by the resistance of the layers traversed by the current, i.e. firstly by the resistance of the $p^+$, i and $n^+$ layers, as for a normal diode and then by the resistance of the layer i which is again traversed and that of the $p^+$ layer. The resistance of the PINIP structure is therefore scarcely greater than that of an ordinary PIN diode. For a 10 μm wide, 20 μm long structure, said resistance is approximately 10 ohms.

With regards to the capacitance of the PINIP structure, it is the same as two diodes connected in series. The inverse of the total capacitance is consequently equal to the sum of the inverses of the capacitances of the two diodes. Therefore the total capacitance is substantially equal to half the capacitance of a single diode for a zero voltage. By increasing the voltage, the capacitance of the forward biased PIN will increase and that of the reverse bias PIN will tend towards a constant value corresponding to the capacitance of a single diode.

With regards to the photocurrent, it is produced by that part of the PINIP which is depleted in charge carriers and reverse biased and it transverses the forward biased part of the PINIP only if the polarization applied compensates its depletion at the voltage V=0. In other words, with a zero polarization or bias, the two intrinsic zones are depleted. By illuminating one of the parts of the PINIP, the photocurrent created will be blocked by the other, depleted part. By applying a voltage, part of the PINIP will be reverse biased and remain depleted, whereas the other, forward biased part will become conductive.

The first diode operating in the reverse direction (the photocurrent created flowing in the blocked direction) will therefore behave like a current generator supplying into the second diode biased in the forward direction. Although the PINIP structure prevents the external current from passing through, the photocurrent can be detected. This is due to the fact that the photocurrent in a PIN diode flows in the reverse direction to the conductive direction of an external current.

The photocurrent detected by the PINIP structure according to the invention is shown in FIG. 8 in a conventional current-voltage I–V diagram. This diagram also makes it possible to compare the current obtained with that of a conventional PIN diode.

In FIG. 8, the curves are designated 1 to 6 and correspond to the following conditions:

curve 1: a single PIN diode in darkness, curve 2: PINIP structure in darkness, curve 3: a single PIN diode illuminated, curve 4: PINIP structure illuminated, curve 5: difference between curves 4 and 2 (PINIP structure illuminated and not illuminated), curve 6: difference between curves 3 and 1 (a single PIN diode illuminated and not illuminated).

It is pointed out that for a voltage exceeding 0.5 V, the same photocurrent is obtained. For a lower voltage, the photocurrent of the PINIP is no longer detected, because it is blocked by the depleted zone of the forward biased diode. In general, the PIN diodes are polarized to voltages exceeding 1 V, so that the PINIP structure can replace the PIN diode without any detection problem. However, the darkness current is greater, because there are two junctions (pi and ip), but still remains low (6 nA at 2 V instead of 4 nA).

As has been stated hereinbefore, the present invention not only solves the problems linked with the production of the photodetector (the same metallization at the same level), but also permits a better utilization of the optical part. The latter advantage is illustrated in FIGS. 9 to 12 showing a few non-limitative embodiments of the invention.

Figure 9:
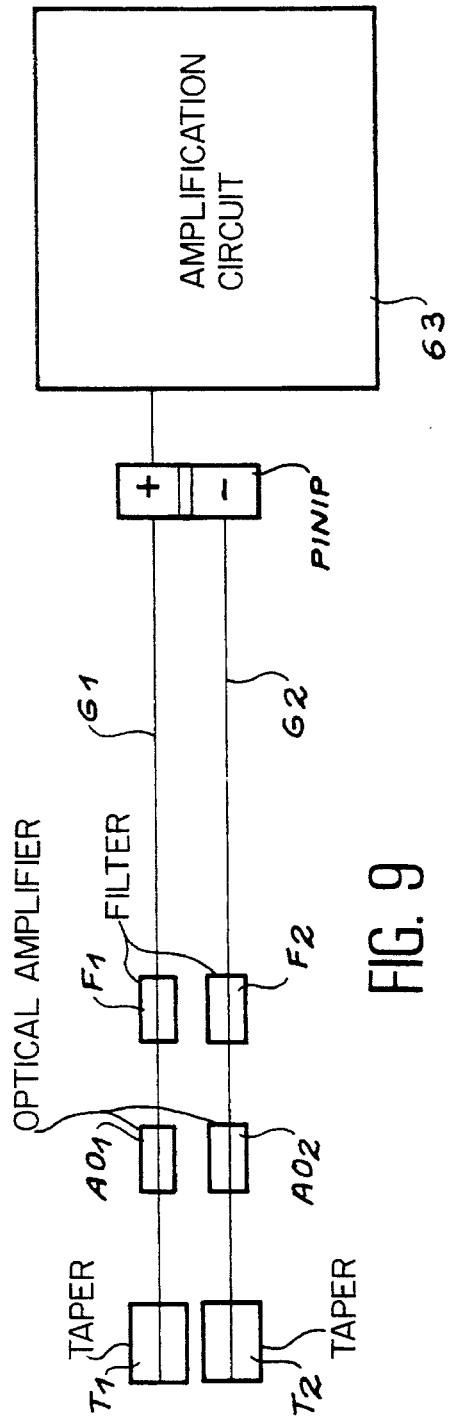
FIG. 9 Illustrates a first application of the invention to an optoelectronic device for direct detection.

FIG. 9 shows a device for the amplification and direct detection which is of a known type, but which has the original feature of two channels instead of one, as well as a single photodetector. Each channel has an optical transition device or taper designated T1 for one channel and T2 for the other, an optical amplifier $AO_1$ ($AO_2$), an optical filter F1 (F2), an optical guide G1 (G2) and a single PINIP photodetection structure connected to an electronic amplification circuit 63. One of the optical guides passes beneath one of the diodes of the PINIP structure and the other passes under the other diode.

Figure 10:
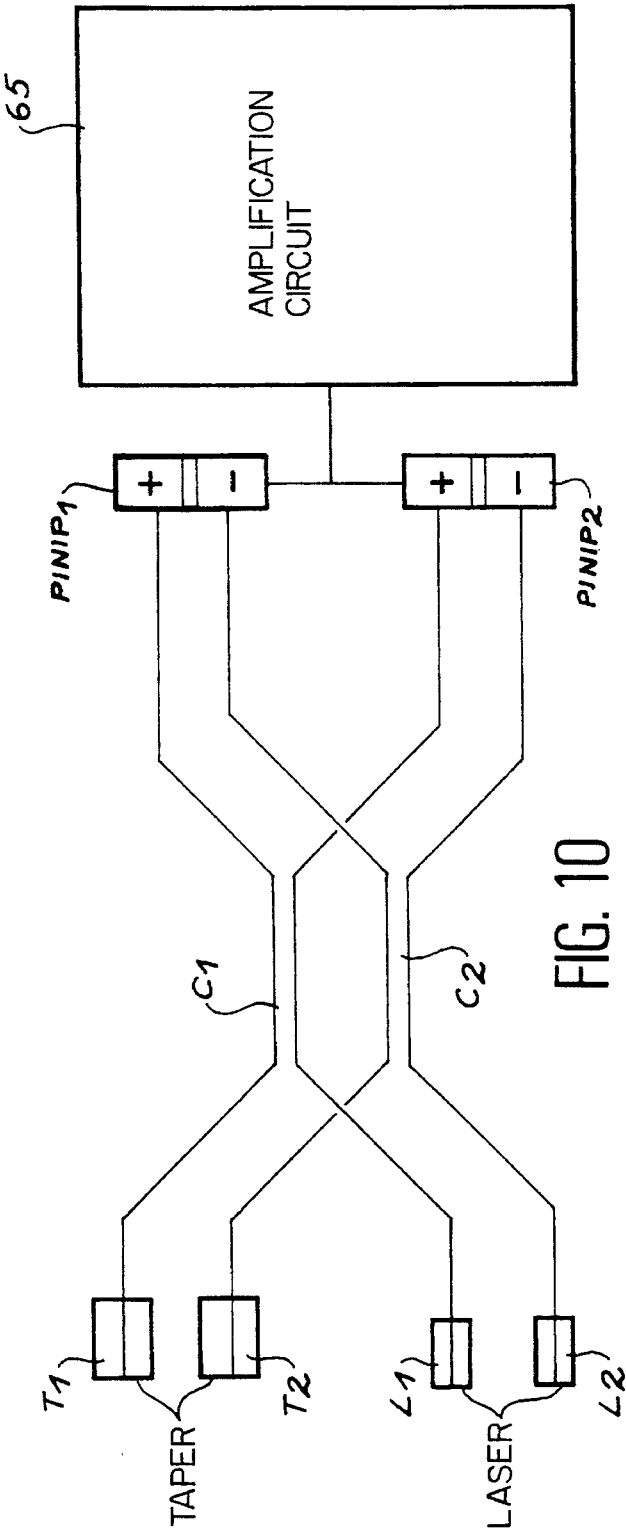
FIG. 10 Illustrates a second application of the invention to an optoelectronic device for coherent detection for a single optical polarization.

FIG. 10 shows a coherent detection means for a single light polarization. This device differs from the prior art by doubling the means combined with a photodetector. The device shown has two tapers T1, T2, two laser sources L1, L2, two 3 dB couplers C1, C2 and two photodetectors respectively PINIP 1 and PINIP 2 connected to an electronic amplification circuit 65.

Figure 11:
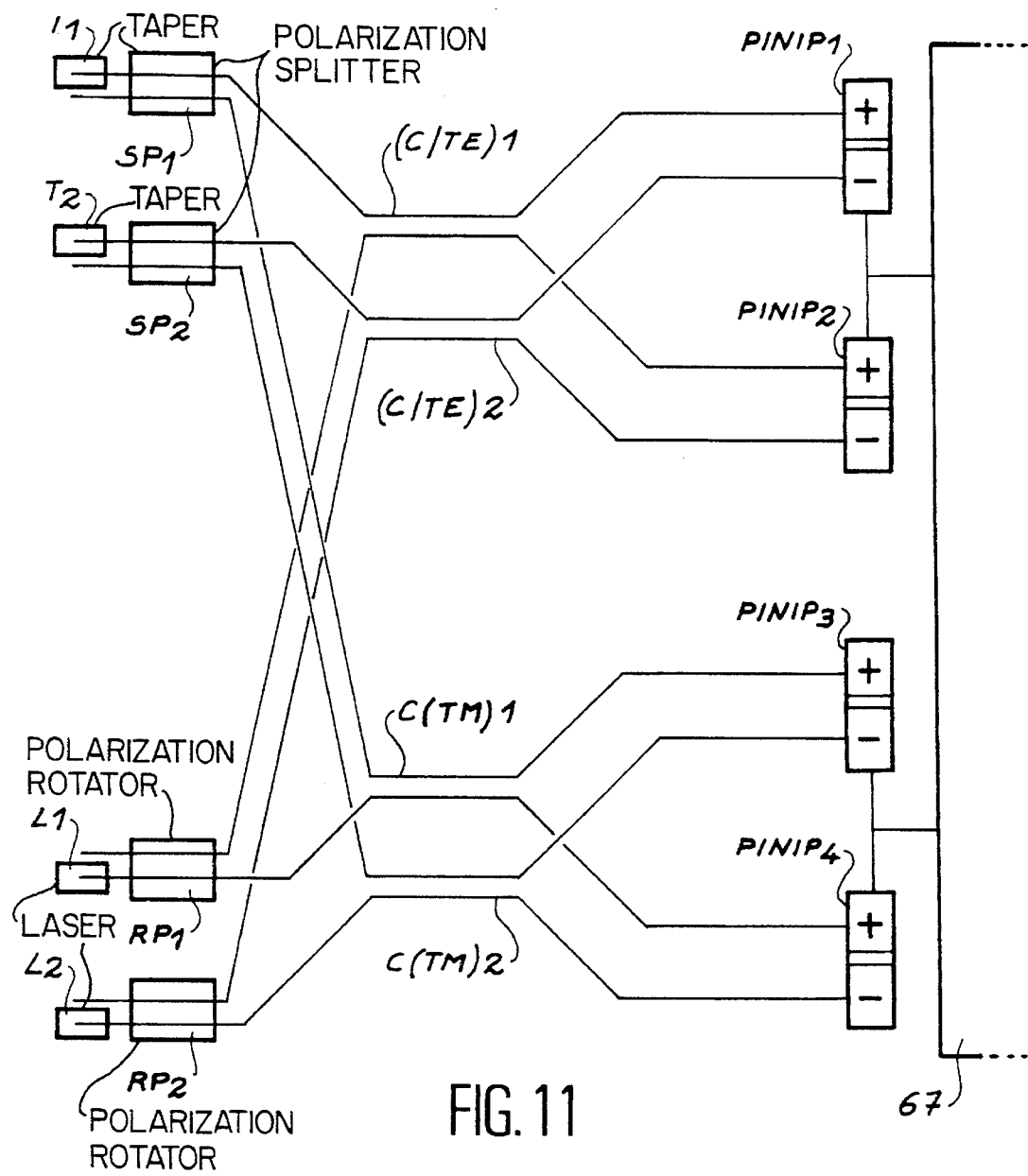
FIG. 11 Illustrates a third application of the invention to an optoelectronic device having four optical couplers for coherent detection and with polarization diversity.

FIG. 11 shows a coherent detection, polarization diversity means comprising:

on the one hand, two tapers T1, T2, two polarization splitters SP1, SP2, two couplers operating in the transverse electric mode $(C/TE)_1$ and $(C/TE)_2$ and two photodetectors PINIP 1 and PINIP 2, on the other hand, two lasers L1, L2, two polarization rotators RP1, RP2, two couplers operating in the transverse magnetic mode $(C/TM)_1$ and $(C/TM)_2$ and two other photodetectors PINIP 3 and PINIP 4.

The four PINIP photodetectors are connected to an electronic circuit 67.

The interest of these devices is that, as a result of the invention, they have a certain redundancy, each of the two guides passing beneath the PINIP structure being usable in random manner. If one of the channels becomes defective, it is still possible to use the other by transferring the photodetection function to the corresponding PIN diode. This transfer is immediate, because it is merely necessary to switch the polarization or biasing direction. Therefore the life of these devices is increased and consequently so is their reliability.

Figure 12:
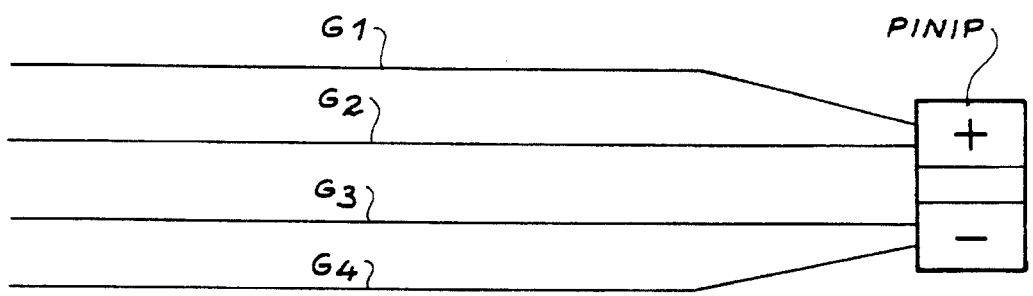
FIG. 12 Illustrates a fourth application of the invention to an optoelectronic device with four optical guides and a single PINIP structure.

Finally, FIG. 12 shows four guides G1, G2, G3, G4 associated with a single PINIP photodetector and only the best of the four guides will be used.

In all the examples described, the PINIP photodetector can be illuminated from the top through the p layers and therefore by direct illumination without using the guide. The latter makes it possible to add an optical function.

All the present description has referred to the PINIP variant, but this can easily be transposed to the NIPIN variant by reversing the n and p layers.

I claim:

1. Optoelectronic device having an integrated optical guide and photodetector comprising, on the same substrate, layers constituting optical guidance means and, on part of these layers, a photodetector constituted by a first stack of semiconductor layers forming a first diode, said device also incorporating means for polarizing the first diode, said device being characterized in that the photodetector also has a second stack, identical to the first stack and placed alongside said first stack, said second stack constituting a second diode, the polarization means being connected to the second diode through the first diode, the two diodes, thus being arranged in head to tail manner, one being reverse biased and the other forward biased.

2. Device according to claim 1, characterized in that the photodetector is of the PINIP type.

3. Device according to claim 1, characterized in that the photodetector is of the NIPIN type.

4. Optoelectronic device according to claim 1, characterized in that the photodetector has a single n type, lower semiconductor layer placed above optical guidance means, a single intrinsic semiconductor layer, a first and a second p type diffused zone placed side by side on the surface of the intrinsic semiconductor layer, a first and a second metallic contact surmounting the first and second diffused zone.

5. Optoelectronic device according to claim 2, characterized in that each of the first and second PIN diodes has a n type semiconductor layer placed above optical guidance means, an intrinsic semiconductor layer, a p doped epitaxied layer and a metallic contact placed on the p doped layer, the first n type semiconductor layer being common to the first and second diodes.

6. Device according to any one of the claims 1 to 5, characterized in that the optical guidance means comprise at least one first optical guide and one second optical guide, said guides being juxtaposed on the substrate, the first guide passing beneath the first stack constituting the first PIN diode, the second guide passing beneath the second stack constituting the second PIN diode, photodetection taking place in whichever of the two diodes is reverse biased for the corresponding optical guide.

7. Device according to claim 2, characterized in that the PINIP photodetector is illuminated from above through the P layers.

* * * * *